US012677597B2

(12) United States Patent
Nakamura et al.

(10) Patent No.: US 12,677,597 B2
(45) Date of Patent: Jul. 7, 2026

(54) PIEZOELECTRIC LAMINATE AND PIEZOELECTRIC ELEMENT

(71) Applicant: FUJIFILM Corporation, Tokyo (JP)

(72) Inventors: Seigo Nakamura, Kanagawa (JP); Hiroyuki Kobayashi, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 988 days.

(21) Appl. No.: 17/894,863

(22) Filed: Aug. 24, 2022

(65) Prior Publication Data

US 2023/0098590 A1 Mar. 30, 2023

(30) Foreign Application Priority Data

Sep. 27, 2021 (JP) ................................. 2021-157101

(51) Int. Cl.
  *H01L 41/047* (2006.01)
  *H10N 30/00* (2023.01)
  *H10N 30/853* (2023.01)
  *H10N 30/87* (2023.01)

(52) U.S. Cl.
  CPC ......... *H10N 30/877* (2023.02); *H10N 30/708* (2024.05); *H10N 30/8554* (2023.02)

(58) Field of Classification Search
  CPC . H10N 30/877; H10N 30/8554; H10N 30/708
  See application file for complete search history.

(56) References Cited

U.S. PATENT DOCUMENTS

| | | | |
|---|---|---|---|
| 2010/0213795 A1 | 8/2010 | Li et al. | |
| 2011/0121096 A1 | 5/2011 | Nihei et al. | |
| 2011/0221306 A1* | 9/2011 | Matsuda ............ | H10N 30/2047 |
| | | | 29/25.35 |
| 2012/0171785 A1* | 7/2012 | Takamatsu ............. | H10D 1/694 |
| | | | 257/E21.008 |
| 2013/0300254 A1 | 11/2013 | Fujii et al. | |
| 2015/0280100 A1* | 10/2015 | Burak .................... | H03H 9/171 |
| | | | 310/321 |

(Continued)

FOREIGN PATENT DOCUMENTS

| | | |
|---|---|---|
| JP | 2000-36569 A | 2/2000 |
| JP | 2002-25991 A | 1/2002 |

(Continued)

OTHER PUBLICATIONS

English Translation of JP 2010056426 (Year: 2010).*

(Continued)

*Primary Examiner* — Bryan P Gordon
(74) *Attorney, Agent, or Firm* — Birch, Stewart, Kolasch & Birch, LLP

(57) ABSTRACT

A piezoelectric laminate and a piezoelectric element have, on a substrate in the following order, a lower electrode layer and a piezoelectric film containing a perovskite-type oxide. The lower electrode layer includes a second layer arranged in a state of being in contact with the piezoelectric film and includes a first layer arranged on a side of the second layer from the substrate, where the first layer contains one or more of W, Mo, Nb, and Ta, as a main component, and the second layer contains Ir as a main component, where the thickness of the second layer is 50 nm or less.

12 Claims, 6 Drawing Sheets

(56)          References Cited

U.S. PATENT DOCUMENTS

| | | | |
|---|---|---|---|
| 2016/0043299 A1* | 2/2016 | Fujimori ............. | H10N 30/875 |
| | | | 29/25.35 |
| 2017/0186936 A1* | 6/2017 | Fujii ....................... | B41J 2/161 |
| 2018/0138393 A1 | 5/2018 | Sumi et al. | |

FOREIGN PATENT DOCUMENTS

| | | | |
|---|---|---|---|
| JP | 2004-153019 A | 5/2004 | |
| JP | 2004-186646 A | 7/2004 | |
| JP | 2010-34448 A | 2/2010 | |
| JP | 2010-56426 A | 3/2010 | |
| JP | 2012-519378 A | 8/2012 | |
| JP | 2018-82052 A | 5/2018 | |
| WO | WO 2016/051644 A1 | 4/2016 | |
| WO | WO 2022/070524 A1 | 4/2022 | |

OTHER PUBLICATIONS

Japanese Office Action for corresponding Japanese Application No. 2021-157101, dated Nov. 26, 2024, with English translation.
European Communication pursuant to Article 94(3) EPC for corresponding European Application No. 22191043.3, dated Nov. 14, 2023.
Extended European Search Report for European Application No. 22191043.3, dated Feb. 20, 2023.

* cited by examiner

REFERENCE POSITION

PIEZOELECTRIC LAMINATE AND PIEZOELECTRIC ELEMENT

CROSS REFERENCE TO RELATED APPLICATIONS

The present application claims priority under 35 U.S.C. § 119 to Japanese Patent Application No. 2021-157101 filed on Sep. 27, 2021. The above application is hereby expressly incorporated by reference, in its entirety, into the present application.

BACKGROUND OF THE INVENTION

1. Field of the Invention

The present disclosure relates to a piezoelectric laminate and a piezoelectric element.

2. Description of the Related Art

As a material having excellent piezoelectric characteristics and excellent ferroelectricity, there is known a perovskite-type oxide such as lead zirconate titanate ($Pb(Zr,Ti)O_3$, hereinafter referred to as PZT). A piezoelectric body consisting of a perovskite-type oxide is applied as a piezoelectric film in a piezoelectric element having a lower electrode, a piezoelectric film, and an upper electrode on a substrate. This piezoelectric element has been developed into various devices such as a memory, an inkjet head (an actuator), a micromirror device, an angular velocity sensor, a gyro sensor, a piezoelectric micromachined ultrasonic transducer (PMUT), and an oscillation power generation device.

In a case of applying a piezoelectric element to a device, it is desirable that the piezoelectric element has high piezoelectric characteristics because higher piezoelectric characteristics lead to power saving. So far, for the improvement of the piezoelectric characteristics, methods such as improving the crystallinity of the piezoelectric film and reducing the resistance of the electrode layer have been studied.

As the lower electrode layer of the piezoelectric element, an Ir layer is used in a large number of cases from the viewpoint of the adhesiveness to the piezoelectric film and the reduction of the resistance. It is noted that, for the reduction of the resistance, the Ir layer is generally made to have a thickness of 150 nm or more. Further, although the Ir layer has good adhesiveness to the piezoelectric film, it does not have good adhesiveness to the silicon substrate, and thus in a large number of cases, an intimate attachment layer consisting of a TiW layer or a Ti layer is provided between the Ir layer and the substrate (WO2016/051644A and JP2018-82052A).

JP2010-056426A proposes a laminated structure in which an Ir layer and an Au layer are laminated for more reduction of the resistance of the lower electrode layer. In a case of using Au, which has higher conductivity than Ir, it is possible to realize the reduction of the resistance of the entire lower electrode layer.

SUMMARY OF THE INVENTION

In a case where a piezoelectric film containing a perovskite-type oxide as a main component is formed on an Ir layer, there is a problem that a pyrochlore phase, which is a different phase, is easily formed at the interface between the piezoelectric film and the lower electrode layer. The pyrochlore phase is paraelectric, and thus the deterioration of the piezoelectric characteristics, such as a decrease in the dielectric constant and a decrease in the piezoelectric constant occurs in a case where the pyrochlore phase is formed. Further, in a piezoelectric element including a pyrochlore phase at the interface between the piezoelectric film and the lower electrode layer, peeling or the like occurs easily, and thus the low long-term reliability is low as compared with a piezoelectric element in which the pyrochlore phase is suppressed.

As in JP2010-056426A, in a case where an Au layer is provided in the lower electrode layer, the reduction of the resistance can be realized. On the other hand, it has been found that in a case where an Au layer is provided in the lower electrode layer, the long-term reliability decreases as compared with a case of the laminated structure of the Ir layer and the TiW or Ti intimate attachment layer, which is disclosed in WO2016/051644A and JP2018-82052A. It is conceived that this is because the diffusion of Au occurs due to carrying out the high temperature film formation in a case of forming a piezoelectric film according to a sputter film formation on the lower electrode layer. Due to having a relatively low melting point, it is presumed that Au diffuses into the piezoelectric film at the time of the formation of the piezoelectric film, and thus leaking easily occurs.

The technique of the present disclosure has been made in consideration of the above circumstances, and an object of the present disclosure is to provide a piezoelectric laminate and a piezoelectric element having improved long-term reliability without decreasing the piezoelectric characteristics as compared with the case of the related art.

Specific means for solving the above problems include the following aspects.

A piezoelectric laminate of the present disclosure is a piezoelectric laminate comprising, on a substrate in the following order:

a lower electrode layer; and a piezoelectric film containing a perovskite-type oxide, wherein the lower electrode layer includes a second layer arranged in contact with the piezoelectric film and includes a first layer arranged on a side of the substrate than the second layer, the first layer contains one or more of W, Mo, Nb, and Ta, as a main component, and the second layer has Ir as a main component, where the thickness of the second layer is 50 nm or less.

In the piezoelectric laminate of the present disclosure, it is preferable that the thickness of the second layer is 45 nm or less.

In the piezoelectric laminate of the present disclosure, it is preferable that a first intimate attachment layer that improves adhesiveness between the substrate and the first layer is provided between the substrate and the first layer.

The first intimate attachment layer is preferably a TiW layer.

In the piezoelectric laminate of the present disclosure, it is preferable that a second intimate attachment layer that improves adhesiveness between the first layer and the second layer is provided between the first layer and the second layer.

The second intimate attachment layer is preferably a TiW layer.

In the piezoelectric laminate of the present disclosure, it is preferable that the first layer is a W layer.

In the piezoelectric laminate of the present disclosure, it is preferable that the perovskite-type oxide is a compound represented by General Formula (1), $$Pb\{(Zr_xTi_{1-x})_{1-y}B1_y\}O_3 \qquad (1)$$

$0<x<1$, $0<y<0.4$, and

B1 is one or more elements selected from V, Nb, Ta, Sb, Mo, and W.

In the piezoelectric laminate of the present disclosure, it is preferable that the half width at half maximum of the X-ray diffraction peak from the (111) plane of the Ir of the second layer is 0.3° or more.

In the piezoelectric laminate of the present disclosure, it is preferable that the second layer is a uniaxial alignment film in which Ir is aligned in a (111) plane, and the (111) plane has an inclination of 1° or more with respect to a thickness direction.

In the piezoelectric laminate of the present disclosure, it is preferable that a pyrochlore phase is included at an interface between the lower electrode layer and the piezoelectric film, and a thickness of the pyrochlore phase is 20 nm or less.

The piezoelectric element of the present disclosure has the piezoelectric laminate of the present disclosure and an upper electrode layer provided on the piezoelectric film of the piezoelectric laminate.

According to the piezoelectric laminate and the piezoelectric element of the present disclosure, it is possible to improve long-term reliability without decreasing the piezoelectric characteristics as compared with the case of the related art.

DESCRIPTION OF THE PREFERRED EMBODIMENTS

Figure 1:
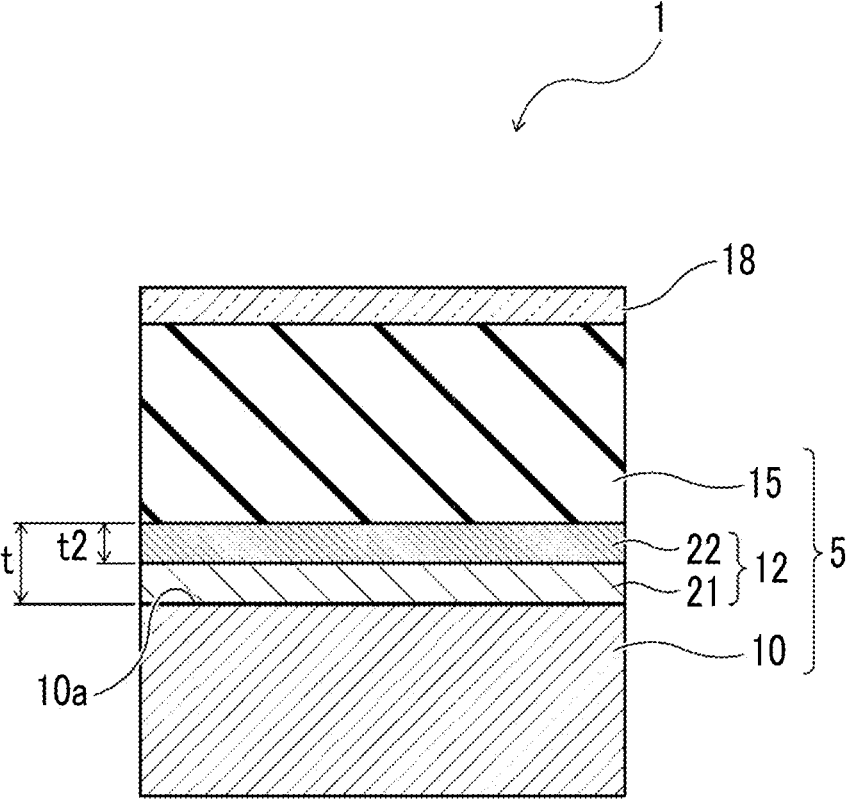
FIG. 1 is a cross-sectional view illustrating a layer configuration of a piezoelectric element according to one embodiment.

Hereinafter, embodiments of the present invention will be described with reference to the drawings. In the drawings below, the layer thickness of each of the layers and the ratio therebetween are appropriately changed and drawn for easy visibility, and thus they do not necessarily reflect the actual layer thickness and ratio.

Piezoelectric laminate 5 and piezoelectric element 1, according to first embodiment FIG. 1 is a cross-sectional view illustrating layer configurations of a piezoelectric laminate 5 and a piezoelectric element 1 having the piezoelectric laminate 5, according to a first embodiment. As illustrated in FIG. 1, the piezoelectric element 1 has the piezoelectric laminate 5 and an upper electrode layer 18. The piezoelectric laminate 5 has a substrate 10 and a piezoelectric film 15 laminated on the substrate 10, where the piezoelectric film 15 includes a lower electrode layer 12 and contains a perovskite-type oxide. Here, "lower" and "upper" do not respectively mean top and bottom in the vertical direction. As result, an electrode arranged on the side of the substrate 10 with the piezoelectric film 15 being interposed is merely referred to as the lower electrode layer 12, and an electrode arranged on the side of the piezoelectric film 15 opposite to the substrate 10 is merely referred to as the upper electrode layer 18.

In the piezoelectric laminate 5 and the piezoelectric element 1 according to the present embodiment, the lower electrode layer 12 includes a second layer 22 arranged in a state of being in contact with the piezoelectric film 15 and includes a first layer 21 arranged on a side of the second layer 22 from the substrate 10. The first layer 21 contains one or more of tungsten (W), molybdenum (Mo), niobium (Nb), and tantalum (Ta), as a main component. Here, the "main component" refers to a component that occupies 95 wt % or more of the constituent elements. "Contains one or more as a main component" means that only one of W, Mo, Nb, or Ta may be contained as a main component, or two or more thereof may be combinedly contained as a main component. In a case where the first layer 21 contains only one of W, Mo, Nb, and Ta, the one thereof occupies 95 wt % or more. For example, it means that W occupies 95 wt % or more in a case where the first layer 21 contains only W in the above group. Further, it means that the total of two or more elements contained occupies 95 wt % or more in a case where the first layer 21 contains two or more of W, Mo, Nb, and Ta. For example, it means that the total content of W and Mo occupies 95 wt % or more in a case where the first layer 21 contains W and Mo as main components. It is particularly preferable that the first layer 21 is a layer containing W as a main component. All of W, Mo, Nb, and Ta are metals having a high melting point. Here, the metal having a high melting point refers to a metal having a melting point of iron (Fe) of 1,538° C. or higher.

The second layer 22 is a layer containing Ir as a main component, and in the following description, the second layer 22 may be referred to as an Ir layer 22. The thickness t2 of the Ir layer 22 is 50 nm or less. The thickness t2 is preferably less than 50 nm and more preferably 45 nm or less. In addition, the thickness t2 is preferably 10 nm or more. The inventors of the present invention have found that in a case of setting the thickness t2 of the Ir layer 22 to 50 nm or less and preferably less than 50 nm, it is possible to suppress the growth of the pyrochlore phase at the initial stage of the formation of the piezoelectric film 15 that is formed on the Ir layer 22 (see Examples). The inventors of the present invention presume that in a case where the thickness t2 of the Ir layer 22 is set to 50 nm or less, the preferential alignment in the Ir (111) plane does not reach a sufficient alignment level, which enables a state having a low crystallinity, and thus it is possible to suppress the growth of the pyrochlore phase at the time of the formation of the piezoelectric film 15. It is noted that in a case of setting the thickness of the Ir layer 22 to 10 nm or more, it is possible to form the Ir layer 22 into a uniform film shape, which is preferable.

The thickness of the Ir layer 22 is 50 nm or less, which is thin as compared with the Ir layer in the related art, and thus the first layer 21 is provided in order to have sufficient conductivity as the lower electrode layer 12.

The thickness t of the entire lower electrode layer 12 is preferably 150 nm or more, more preferably 160 nm or more, and still more preferably 170 nm or more.

The thickness t of the lower electrode layer 12 and the thickness t2 of the Ir layer 22 can be estimated from a scanning electron microscope (SEM) image of a cross section of a piezoelectric element, a transmission electron microscope (TEM) image, or a secondary ion mass spectrometry (SIMS) analysis.

The half width at half maximum of an X-ray diffraction peak (hereinafter, referred to as an Ir (111) peak) from the (111) plane in the Ir layer 22 is preferably 0.3° or more. The half width at half maximum of the Ir (111) peak is more preferably 0.35° or more. In addition, the half width at half maximum of the Ir (111) peak is preferably 0.45° or less and more preferably 0.4° or less.

Here, the half width at half maximum of the Ir (111) peak shall be measured as follows. The upper electrode layer 18 of the piezoelectric element is removed, and an XRD chart according to the X-ray diffraction (XRD) of a thin film is acquired in a state where the lower electrode layer 12 and the piezoelectric film 15 are provided on the substrate 10. The Ir (111) peak in the XRD chart is subjected to fitting with a predetermined function. The Ir (111) peak appears in the vicinity of 2θ=40.7°. The half width at half maximum is determined as an interval between a 2θ value at which the maximum value of a peak is shown and a 2θ value at which the half value of the maximum value is obtained and which is on a side where the peak of the maximum value does not overlap with the other peaks (see FIG. 7).

In a case where a film of Ir is formed on a substrate according to sputtering, Ir is preferentially aligned in the (111) plane to form a natural alignment film. Crystallinity is associated with the half width at half maximum of the Ir (111) peak in the XRD chart (see FIG. 7) that is obtained by the XRD diffraction method. The wider the half width at half maximum of the Ir (111) peak is, the lower the crystallinity is, and the narrower the half width is, the higher the crystallinity is. In a case where the half width at half maximum is 0.3° or more, the alignment state of the (111) plane in the Ir layer 22 is disturbed, and thus the crystallinity is slightly low.

Further, in the present embodiment, the (111) plane in the Ir layer 22 has an inclination of 1° or more with respect to the thickness direction.

Figure 2:
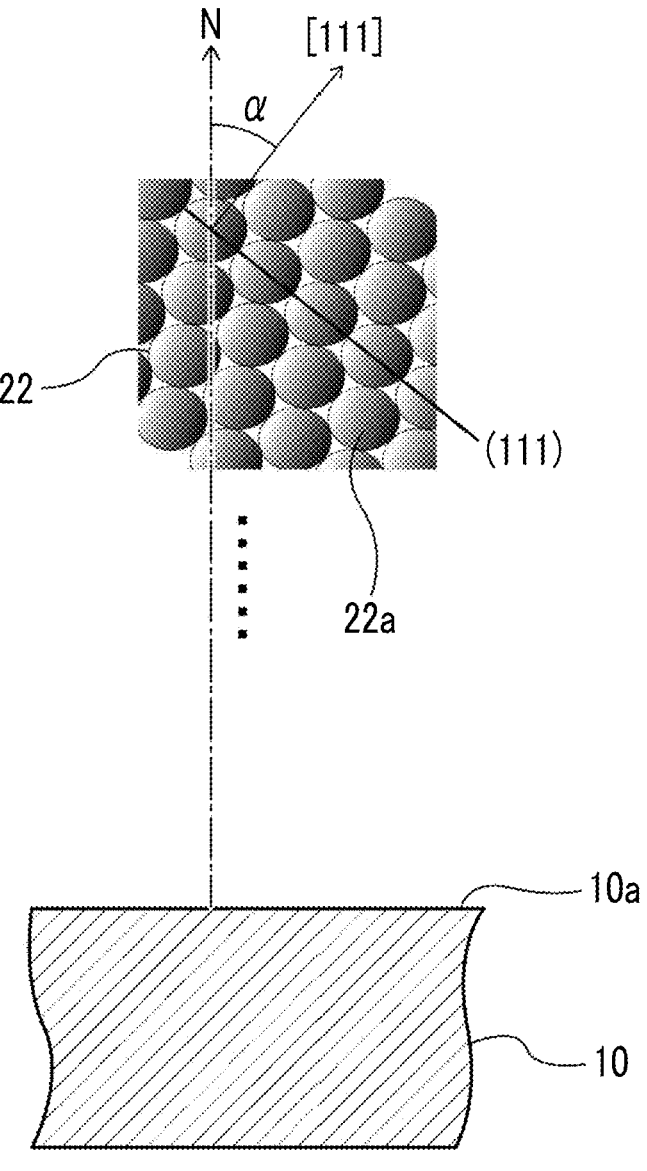
FIG. 2 is an explanatory view of an alignment state of a second layer (an Ir layer) of a lower electrode layer in the present embodiment.

FIG. 2 is a view schematically illustrating the Ir layer 22 according to the present embodiment, and particles 22a in the figure indicate the Ir element. As illustrated in FIG. 2, being inclined by 1° or more with respect to the thickness direction of the (111) plane means that an inclination a with respect to a thickness direction N, in a direction [111] perpendicular to the (111) plane, is 1° or more. Here, the thickness direction N is the thickness direction of the Ir layer, and it is a direction perpendicular to a surface 10a of the substrate 10. The actual Ir layer 22 contains a large number of crystals, and the inclination directions of the (111) planes of the individual crystals are various. In the present specification, the inclination a of the (111) plane in the Ir layer 22 is defined by a value measured by a locking curve measurement by X-ray diffraction. Specifically, the inclination a of the (111) plane is calculated from the split width of the (111) diffraction peak in the locking curve measurement data (see Examples).

Figure 3:
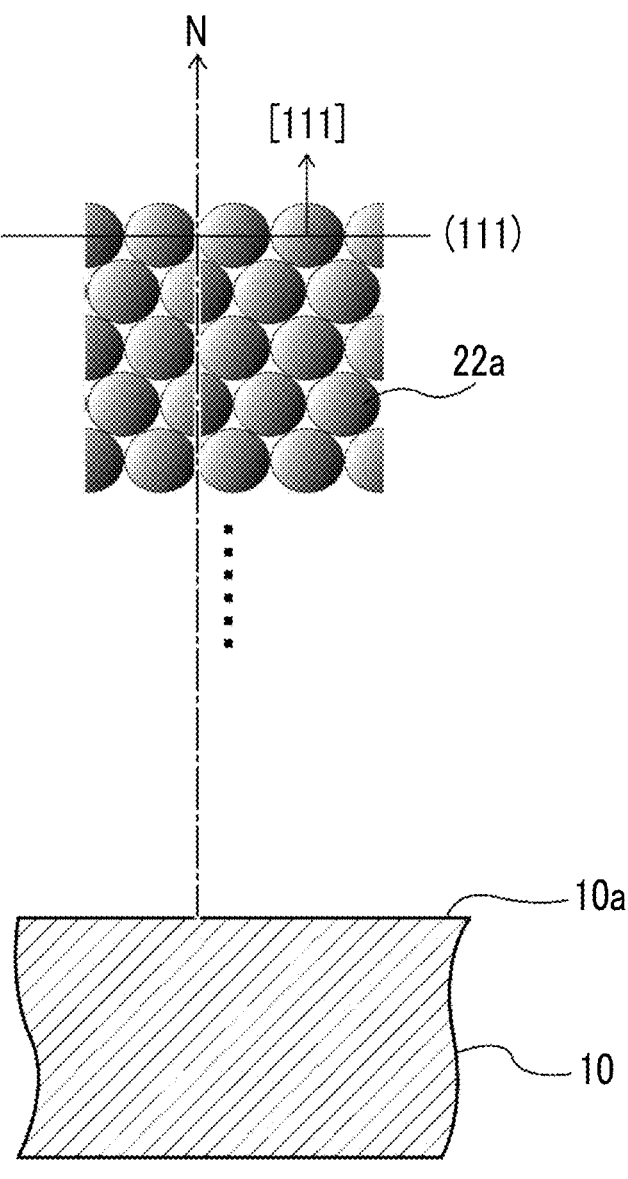
FIG. 3 is an explanatory view of an alignment state of the Ir layer that is used as a lower electrode layer in the piezoelectric element in the related art.

The (111) plane is the preferential alignment plane of Ir, and in the related art, an Ir layer, in which Ir is aligned so that the (111) plane is perpendicular to the thickness direction, that is, the [111] direction coincides with the thickness direction N as illustrated in FIG. 3, has been used as the lower electrode layer. In a case where a piezoelectric film made of a perovskite-type oxide is formed on an Ir layer having high crystallinity as illustrated in FIG. 3, a pyrochlore phase is easily formed at the initial stage of film formation. On the other hand, the inventors of the present invention found that in a case of reducing the crystallinity of the Ir layer 22, it is possible to suppress the growth of the pyrochlore phase (see Examples).

The Ir (111) plane preferably has an inclination a of 1° or more and 15° or less and more preferably has an inclination of 1° or more and 8° or less with respect to the thickness direction N.

It is noted that the larger the inclination a of the (111) plane in the first layer 21 with respect to the thickness direction N is, the higher the effect of suppressing the growth of the pyrochlore phase, which is preferable. On the other hand, in a case of setting the inclination to 15° or less, it is possible to suppress an occurrence that another alignment plane becomes the preferential alignment plane, which is preferable.

The sheet resistance of the lower electrode layer 12 is preferably 1 Ω/sq or less and more preferably 0.8 Ω/sq or less. The sheet resistance can be measured according to the four-point probe method by using a resistivity meter.

The piezoelectric film 15 contains a perovskite-type oxide represented by the general formula $ABO_3$.

In the general formula, A is an A-site element, which is one of Pb, barium (Ba), lanthanum (La), Sr, bismuth (Bi), lithium (Li), sodium (Na), calcium (Ca), cadmium (Cd), magnesium (Mg), or potassium (K), or a combination of two or more thereof.

In the general formula, B is a B-site element, which is one of Ti, Zr, vanadium (V), Nb (niobium), tantalum (Ta), chromium (Cr), molybdenum (Mo), tungsten (W), manganese (Mn), iron (Fe), Ru, cobalt (Co), Ir, nickel (Ni), copper (Cu), zinc (Zn), gallium (Ga), In, tin, antimony (Sb), or a lanthanide element, or a combination of two or more thereof.

In the general formula, O is oxygen.

Regarding A:B:O, a reference ratio is 1:1:3; however, it suffices that the ratio is in a range in which a perovskite structure is obtained.

It is noted that the perovskite-type oxide preferably occupies 80% by mole or more of the piezoelectric film 15, and the perovskite-type oxide more preferably occupies 90% by mole or more thereof. Further, it is preferable that the piezoelectric film 15 is consisting of a perovskite-type oxide (however, it contains unavoidable impurities).

The perovskite-type oxide is preferably a lead zirconate titanate (PZT) type that contains lead (Pb), zirconium (Zr), titanium (Ti), and oxygen (O).

In particular, it is preferable that the perovskite-type oxide is a compound represented by General Formula (1), which contains an additive B in the B site of PZT.

$$Pb\{(Zr_xTi_{1-x})_{1-y}B1_yO_3 \tag{1}$$

Here, B1 is preferably one or more elements selected from vanadium (V), niobium (Nb), tantalum (Ta), Sb (antimony), molybdenum (Mo), and tungsten (W). It is most preferable that B1 is Nb. Here, $0<x<1$ and $0<y<0.4$ are satisfied. It is noted that regarding $Pb:\{(Zr_xTi_{1+x})_{1-y}B_y\}:O$ in General Formula (1), a reference ratio thereof is 1:1:3; however, it suffices that the ratio is in a range in which a perovskite structure is obtained.

B1 may be a single element such as V only or Nb only, or it may be a combination of two or three or more elements, such as a mixture of V and Nb or a mixture of V, Nb, and Ta. In a case where B1 is these elements, a very high piezoelectric constant can be realized in combination with Pb of the A-site element.

Figure 4:
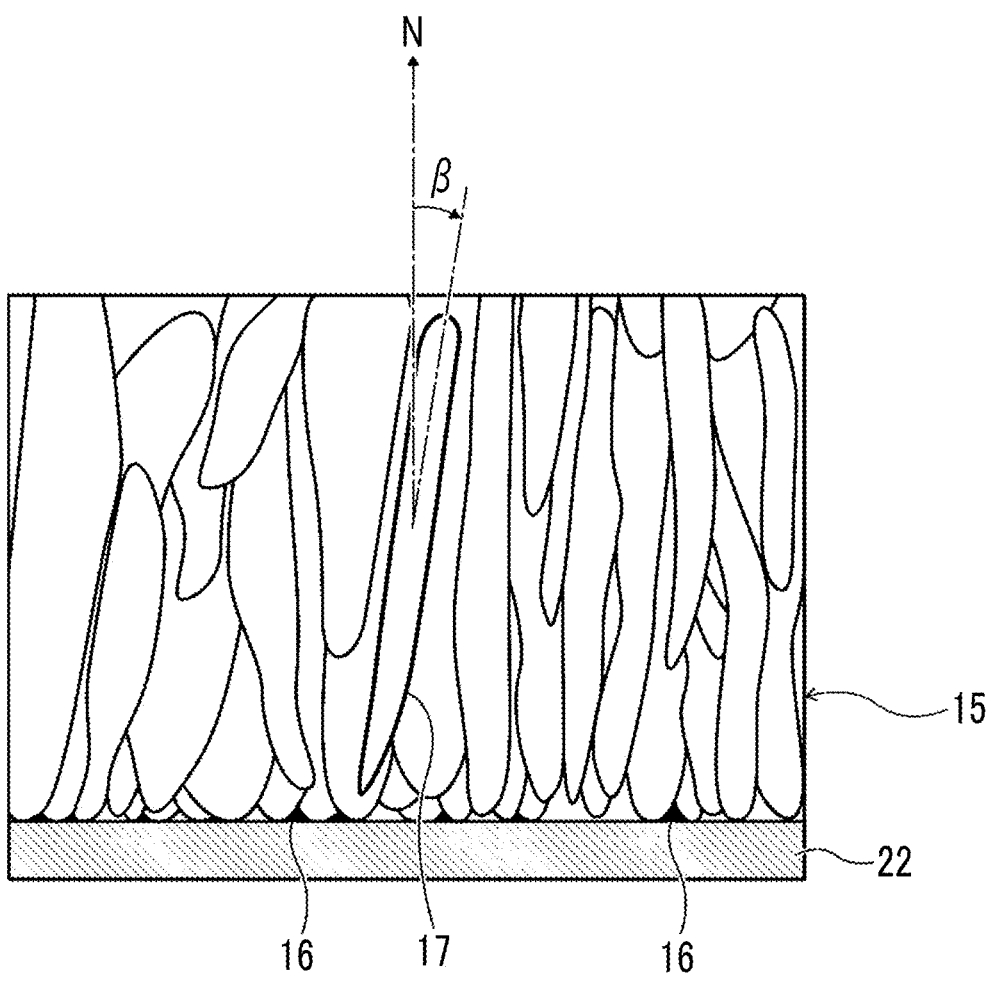
FIG. 4 is an enlarged schematic view of a piezoelectric film.

As illustrated in the schematic cross-sectional view of FIG. 4, the piezoelectric film 15 is preferably a columnar structure film having a columnar structure containing a large number of columnar crystal bodies 17. It is preferable that a large number of columnar crystal bodies 17 are uniaxial alignment films that extend non-parallelly with respect to the surface of the substrate 10 (see FIG. 1) and have the same crystal orientation. In a case of adopting an alignment structure, it is possible to obtain larger piezoelectricity. It is noted that the piezoelectric film 15 includes a pyrochlore phase 16 at the interface between the piezoelectric film 15 and the second layer 22 of the lower electrode layer 12. Although details will be described later, the pyrochlore phase 16 is in a state of being sufficiently suppressed. The pyrochlore phase 16 preferably has a thickness of 20 nm or less. It is noted that the pyrochlore phase 16 is not uniformly formed on the surface of the lower electrode layer 12 but is partially grown as illustrated in FIG. 4. The method of calculating the thickness of the pyrochlore phase 16 will be described in Examples.

Further, in the example illustrated in FIG. 4, the longitudinal direction of the columnar crystal has an inclination β of 1° or more with respect to the normal line of the substrate (the thickness direction N). This means that the alignment plane of the piezoelectric film 15 has an inclination of 1° or more with respect to the surface of the substrate. Here, the alignment plane is a (100) plane or a (001) plane. As described above, it is preferable that in the piezoelectric film 15, the (100) plane or (001) plane of the columnar crystals is inclined by 1° or more with respect to the surface of the substrate. In this example, the lattice constants of the a-axis and the c-axis in the perovskite structure are almost the same, and the (100) plane and the (001) plane cannot be distinguished from each other by the analysis by XRD. However, it can be confirmed by XRD analysis that the alignment film is aligned in at least any one of the planes.

The thickness of the piezoelectric film 15 is generally 200 nm or more, and it is, for example, 0.2 μm to 5 μm. However, it is preferably 1 μm or more.

The substrate 10 is not particularly limited, and examples thereof include substrates such as silicon, glass, stainless steel, yttrium-stabilized zirconia, alumina, sapphire, and silicon carbide. As the substrate 10, a laminated substrate having a $SiO_2$ oxide film formed on the surface of the silicon substrate, such as a thermal oxide film-attached silicon substrate, may be used.

The upper electrode layer 18 is paired with the lower electrode layer 12 and is an electrode for applying a voltage to the piezoelectric film 15. The main component of the upper electrode layer 18 is not particularly limited, and examples thereof include, in addition to the electrode material that is generally used in the semiconductor process, a conductive oxide such as indium tin oxide (ITO), $LaNiO_3$, or ($SrRuO_3$ (SRO), and a combination thereof.

The layer thickness of the upper electrode layer 18 is not particularly limited, and it is preferably about 50 nm to 300 nm and more preferably 100 nm to 300 nm.

As described above, in the piezoelectric laminate 5 and the piezoelectric element 1 of the present disclosure, the lower electrode layer 12 includes a second layer 22 arranged in a state of being in contact with the piezoelectric film 15 and includes a first layer 21 arranged on a side of the second layer 22 from the substrate 10. In addition, the first layer 21 contains one or more of W, Mo, Nb, and Ta, as a main component, the second layer 22 contains Ir as a main component, and the thickness of the second layer 22 is 50 nm or less. As described above, the Ir layer that is formed on the substrate according to sputter film formation is preferentially aligned in the (111) plane. The aligning properties of this (111) plane alignment increase as the thickness of the Ir layer 22 increases. In the related art, the Ir layer generally has a thickness of about 150 nm or more for the reduction of the resistance of the lower electrode layer, and the crystallinity of the Ir layer in a case of being deposited up to 150 nm is very high. The inventors of the present invention found that in a case of forming a piezoelectric film of a perovskite-type oxide on the Ir layer, the pyrochlore phase easily grows in a case where the crystallinity of the Ir layer is too high, and the growth of the pyrochlore phase can be suppressed by reducing the crystallinity of the Ir layer as compared with the case of the related art. In a case where the thickness of the layer (the Ir layer 22) which is the second layer 22 containing Ir as a main component is 50 nm or less, the crystallinity is not yet sufficiently high. As a result, in a case of forming the piezoelectric film 15 containing a perovskite-type oxide as a main component on the second layer 22 having a thickness of 50 nm or less, it is possible to suppress the growth of the pyrochlore phase. Since the pyrochlore phase can be suppressed, the piezoelectric characteristics can be improved, and the long-term reliability can be improved. Further, in a case where the thickness of the Ir layer 22 is set to 50 nm or less, the using amount of Ir can be reduced as compared with the case of the related art, and thus the material cost of the lower electrode layer 12 can be suppressed, whereby the manufacturing cost can be suppressed.

In addition, although the reduction of the resistance of the lower electrode layer has been achieved in the related art by setting the thickness of the Ir layer to about 150 nm or more, it has been found that there is a problem that the stress of the Ir layer is large, which is a factor that hinders the improvement of long-term reliability. In the piezoelectric laminate 5 and the piezoelectric element 1 of the present disclosure, the second layer 22 (here, the Ir layer 22) of the lower electrode layer 12 has a thickness of 50 nm or less, and thus the stress is small as compared with the case in the related art, where an Ir layer having a thickness of about 150 nm is provided. The first layer 21 compensates for the reduced conductivity in a case where the thickness of the second layer 22 is set to 50 nm or less. All of W, Mo, Nb, and Ta can realize a lower electrode layer having the same resistivity as in a case of a single layer of the Ir layer. Further, in a case where a film of these metals is formed according to sputter film formation, the stress is small in any case of these metals as compared with Ir. As a result, long-term reliability can be improved.

Further, since all of W, Mo, Nb, and Ta which constitute the first layer 21 have a sufficiently high melting point as compared with Au, diffusion hardly occurs even in a case where the film formation temperature of the piezoelectric film 15 is set to a high temperature (for example, 700° C.), and thus it is possible to suppress a decrease in long-term reliability as compared with a case where an Au layer is provided as in JP2010-056426A.

It is noted that in a case of setting the thickness of the second layer 22 to 45 nm or less, it is possible to further reduce the crystallinity of Ir layer. As a result, the growth of the pyrochlore phase at the time of forming the piezoelectric film 15 can be further suppressed, and the piezoelectric characteristics and the long-term reliability can be further improved.

In the piezoelectric laminate 5 and the piezoelectric element 1 according to the present embodiment, the Ir layer 22 which is the second layer 22 is a uniaxial alignment film aligned in the Ir (111) plane, where the half width at half maximum of an X-ray diffraction peak from the (111) plane of IR is 0.3° or more. As described above, the description that the half width at half maximum of the X-ray diffraction peak is 0.3° or more means that the crystallinity of the Ir layer 22 is slightly low, and sufficient alignment is not achieved in the (111) plane which is the preferential alignment plane. Further, in a case where the Ir (111) plane is disturbed, it is possible to suppress the growth of the pyrochlore phase at the time of the formation of the piezoelectric film 15 containing a perovskite-type oxide, where the piezoelectric film 15 is provided on the upper layer side. Since it is possible to sufficiently suppress the pyrochlore phase, it is possible to obtain the piezoelectric laminate 5 and the piezoelectric element 1, which have the piezoelectric film 15 containing a good perovskite-type oxide. Since the piezoelectric film 15 in which the pyrochlore phase is suppressed is provided, it is possible to obtain high piezoelectric characteristics, and it is possible to obtain higher drive stability as compared with the case of the related art.

It is noted that in a case where the half width at half maximum of the X-ray diffraction peak from the Ir (111) plane of the Ir layer 22 is 0.35° or more, the effect of suppressing the growth of the pyrochlore phase can be further enhanced, and as a result, the piezoelectric characteristics and the drive stability can be further enhanced.

Further, in a case where the half width at half maximum of the X-ray diffraction peak from the Ir (111) plane is 0.45° or less and preferably 0.4° or less, the growth of the pyrochlore phase can be suppressed while maintaining the resistance value of the Ir layer 22 and the adhesiveness to the piezoelectric film 15 at the same level as those of an Ir layer having high crystallinity.

In the piezoelectric laminate 5 and the piezoelectric element 1 according to the present embodiment, the Ir (111) plane of the Ir layer 22 which is the second layer has an inclination of 1° or more with respect to the thickness direction. This indicates that the aligning properties of the Ir (111) plane are disturbed and the crystallinity is low, which is similar to the case of the half width at half maximum being 0.3° or more. In a case where the aligning properties of the Ir (111) plane are slightly decreased, the effect of suppressing the pyrochlore phase can also be obtained.

The piezoelectric film 15 contains a perovskite-type oxide; however, in a case where it contains particularly a perovskite-type oxide containing Pb, the pyrochlore phase is easily formed at the initial stage of film formation since Pb is easily removed. As a result, the effect of suppressing the pyrochlore phase due to the point that the half width at half maximum of the X-ray diffraction peak from the Ir (111) plane is 0.3° or more is particularly high. Among the perovskite-type oxides containing Pb, a PZT-based perovskite-type oxide containing Pb, Zr, Ti, and O has high piezoelectric characteristics and thus is particularly preferable. Still higher piezoelectric characteristics can be obtained particularly in a case where the perovskite-type oxide is a compound represented by General Formula (1), $$Pb\{(Zr_xTi_{1-x})_{1-y}B1_y\}O_3 \qquad (1)$$

where $0<x<1$ and $0<y<0.4$ are satisfied, and B1 is one or more elements selected from V, Nb, Ta, Sb, Mo, and W.

In the above embodiment, the lower electrode layer 12 has a two-layer structure of the first layer 21 and the second layer 22; however, it may include another layer.

Figure 5:
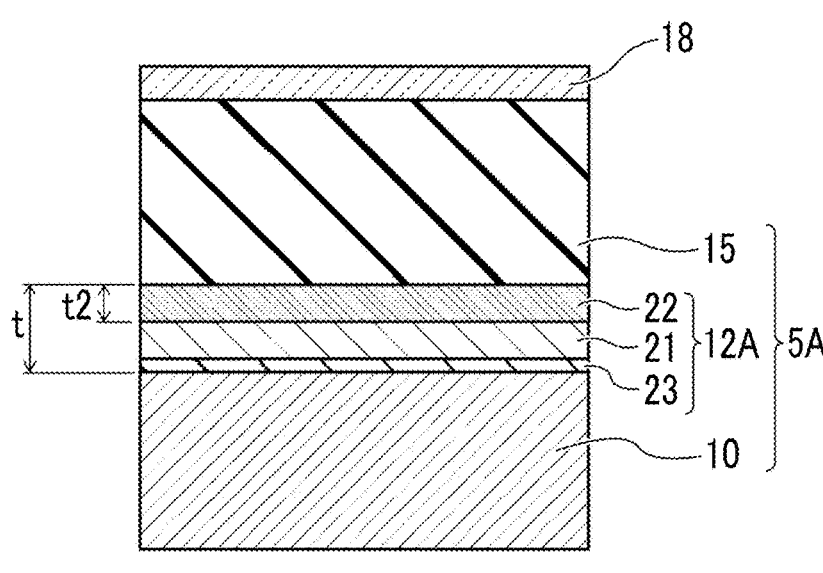
FIG. 5 is a cross-sectional view illustrating a layer configuration of a piezoelectric element in Modification Example 1.
Figure 6:
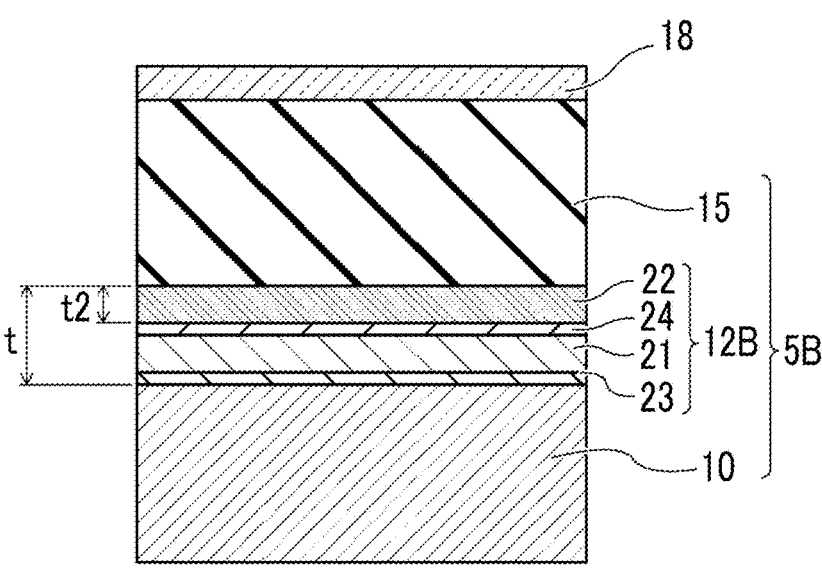
FIG. 6 is a cross-sectional view illustrating a layer configuration of a piezoelectric element in Modification Example 2.

FIG. 5 and FIG. 6 illustrate modification examples of the piezoelectric laminate 5 and the piezoelectric element 1. In FIG. 5 and FIG. 6, the same reference numerals are respectively assigned to the same constituent elements as those illustrated in FIG. 1, and the detailed description thereof will be omitted.

In a piezoelectric laminate 5A and a piezoelectric element 1A of the Modification Example 1 illustrated in FIG. 5, a lower electrode layer 12A has a first intimate attachment layer 23 that improves the adhesiveness between the substrate 10 and the first layer 21, between the substrate 10 and the first layer 21. The first intimate attachment layer 23 is preferably a TiW layer or a Ti layer, and it is particularly preferably a TiW layer.

In a case where the first intimate attachment layer 23 is provided between the substrate 10 and the first layer 21, interlayer peeling can be suppressed, and long-term reliability can be further improved.

In a piezoelectric laminate 5B and a piezoelectric element 1B of the Modification Example 2 illustrated in FIG. 6, a lower electrode layer 12B has a first intimate attachment layer 23, similarly to the piezoelectric laminate 5A and the piezoelectric element 1A of Modification Example 1, and further, it has a second intimate attachment layer 24 between the first layer 21 and the second layer 22. The second intimate attachment layer 24 is provided in order to improve the adhesiveness between the first layer 21 and the second layer 22. Similar to the first intimate attachment layer 23, the second intimate attachment layer 24 is preferably a TiW layer or a Ti layer, and it is particularly preferably a TiW layer.

In a case where the second intimate attachment layer 24 is provided between the first layer 21 and the second layer 22, interlayer peeling can be suppressed, and long-term reliability can be further improved. In a case where the first intimate attachment layer 23 and the second intimate attachment layer 24 are provided, it is possible to further improve the long-term reliability as compared with a case where only one of them is provided.

It is noted that as still another modification example of the piezoelectric laminate and the piezoelectric element, a configuration in which the first intimate attachment layer 23 is not provided between the substrate 10 and the first layer 21, but only the second intimate attachment layer 24 is provided between the first layer 21 and the second layer 22 may be adopted.

It is particularly preferable that the first layer 21 of the lower electrode layer 12 is W and the first intimate attachment layer 23 (and the second intimate attachment layer 24) is TiW. In this case, W of the TiW is less than 95 wt %. In a case where the first layer 21 is W and the first intimate attachment layer 23 (and the second intimate attachment layer 24) is TiW, the adhesiveness is particularly good, and the effect of improving reliability is remarkable.

The piezoelectric element 1 or the piezoelectric laminate 5 according to each of the above embodiments can be applied to an ultrasonic device, a mirror device, a sensor, a memory, and the like.

EXAMPLES

Hereinafter, specific examples and comparative examples of the piezoelectric element of the present disclosure will be described. First, a manufacturing method for a piezoelectric element of each example will be described. A radio frequency (RF) sputtering device was used for the film formation of each layer. It is noted that conditions other than the configuration of the lower electrode layer are common in each example. The description of the manufacturing method will be made with reference to the reference numerals of the respective layers of the piezoelectric element 1B illustrated in FIG. 6.

Film Formation of Lower Electrode Layer

As the substrate 10, a thermal oxide film-attached silicon substrate having a size of 8 inches was used. The lower electrode layer 12 was formed into a film on a thermal oxide film which is the surface of the substrate 10. The layer configuration of the lower electrode layer 12 in each example was as shown in Table 1. For example, in the case of Example 1, as the lower electrode layer 12, a TiW layer, which is the first intimate attachment layer 23, was formed into a film of 20 nm, W, which is the first layer 21, was formed into a film of 100 nm, TiW, which is the second intimate attachment layer 24, was formed into a film of 20 nm, and Ir, which is the second layer 22, was further formed into a film of 50 nm.

The sputter conditions for each layer were as follows. It is noted that the conditions of the distance of 100 mm between the target and the substrate and the substrate set temperature of 350° C. were the same.

Sputter Conditions for TiW Layer
Target input power: 600 W
Ar gas pressure: 0.5 Pa
Sputter Conditions for Ir Layer
Target input power: 600 W
Ar gas pressure: 0.1 Pa
Sputter Conditions for Au Layer
Target input power: 600 W
Ar gas pressure: 0.1 Pa
Sputter Conditions for W Layer
Target input power: 600 W
Ar gas pressure: 0.1 Pa
Sputter Conditions for Mo Layer
Target input power: 600 W
Ar gas pressure: 0.1 Pa
Sputter Conditions for Ta Layer
Target input power: 600 W
Ar gas pressure: 0.1 Pa Formation of Piezoelectric Film The substrate 10 attached with the lower electrode layer 12 was placed in the inside of an RF sputtering device, and an Nb-doped PZT film of 2 μm was formed as the piezoelectric film 15, where the Nb-doping amount to the B site was set to 12 at %. The sputter conditions at this time were as follows.

Sputter Conditions for Piezoelectric Film
Distance between target and substrate: 60 mm
Target input power: 500 W
$Ar/O_2$ gas pressure: 0.3 Pa, an $Ar/O_2$ mixed atmosphere (02 volume fraction: 2.0%)
Substrate set temperature: 700° C.

Film Formation of Upper Electrode Layer

Next, the substrate 10 after forming the piezoelectric film 15 was placed in a film forming chamber of the RF sputtering device, and by using an indium tin oxide (ITO) target, an ITO layer was formed into a film having a thickness of 200 nm as the upper electrode layer 18. It is noted that before the film formation of the upper electrode layer 18, a lift-off pattern for an evaluation sample was prepared on the piezoelectric film 15, and the upper electrode layer 18 was formed on the lift-off pattern. The film forming conditions for the upper electrode layer 18 were as follows.

Sputter Conditions for Upper Electrode Layer
Distance between target and substrate: 100 mm
Target input power: 200 W
Vacuum degree: 0.3 Pa, an $Ar/O_2$ mixed gas ($O_2$ volume fraction: 5%)
Substrate set temperature: room temperature (RT)
Substrate temperature: room temperature Formation of Electrode Pattern for Evaluation After the formation of the upper electrode layer 18, the upper electrode layer was lifted off along the lift-off pattern according to the lift-off method to carry out the pattering of the upper electrode layer 18.

Through the above steps, the piezoelectric laminated substrate of each example, having the lower electrode layer, the piezoelectric film, and the patterned upper electrode layer on the substrate, was produced.

Production of Evaluation Sample

Evaluation sample 1

A strip-shaped portion of 2 mm×25 mm was cut out from the piezoelectric laminated substrate to prepare a cantilever as an evaluation sample 1.

Evaluation Sample 2

A portion of 25 mm×25 mm having, at the center of the surface of the piezoelectric film, an upper electrode layer that had been patterned in a circular shape having a diameter of 400 μm, was cut out from the piezoelectric laminated substrate and used as an evaluation sample 2.

Evaluation of Piezoelectric Characteristics

The piezoelectric constant $d_{31}$ was measured for the evaluation of the piezoelectric characteristics of each of Examples and Comparative Examples.

The piezoelectric element produced as described above was cut into a strip shape of 2 mm×25 mm to produce a cantilever. Then, according to the method described in I. Kanno et. al. Sensor and Actuator A 107 (2003) 68, the lower electrode layer 12 was grounded, and the measurement of the piezoelectric constant $d_{31}$ was carried out by applying a voltage of sine wave of −10 V±10 V to the upper electrode layer 18. The results are shown in Table 1.

Evaluation of Long-Term Reliability

A time dependent dielectric breakdown (TDDB) test was carried out for the evaluation of the long-term reliability of each of Examples and Comparative Examples. Using the evaluation sample 2, in an environment of 120° C., the lower electrode layer 12 was grounded, a voltage of −40 V was applied to the upper electrode layer 18, and the time (hr) taken from the start of the voltage application to the occurrence of dielectric breakdown was measured, and then the long-term reliability was evaluated with the time taken until dielectric breakdown occurred. The measurement results are shown in Table 1.

Measurement of Resistivity

The resistivity (the sheet resistance) of the lower electrode layer 12 was measured with a dedicated four-point probe by using a low resistivity meter Loresta-AX. For each example, the resistivity was measured at the time when the lower electrode layer 12 was formed into a film on the substrate 10.

Half Width at Half Maximum of Ir (111) Peak

Figure 7:
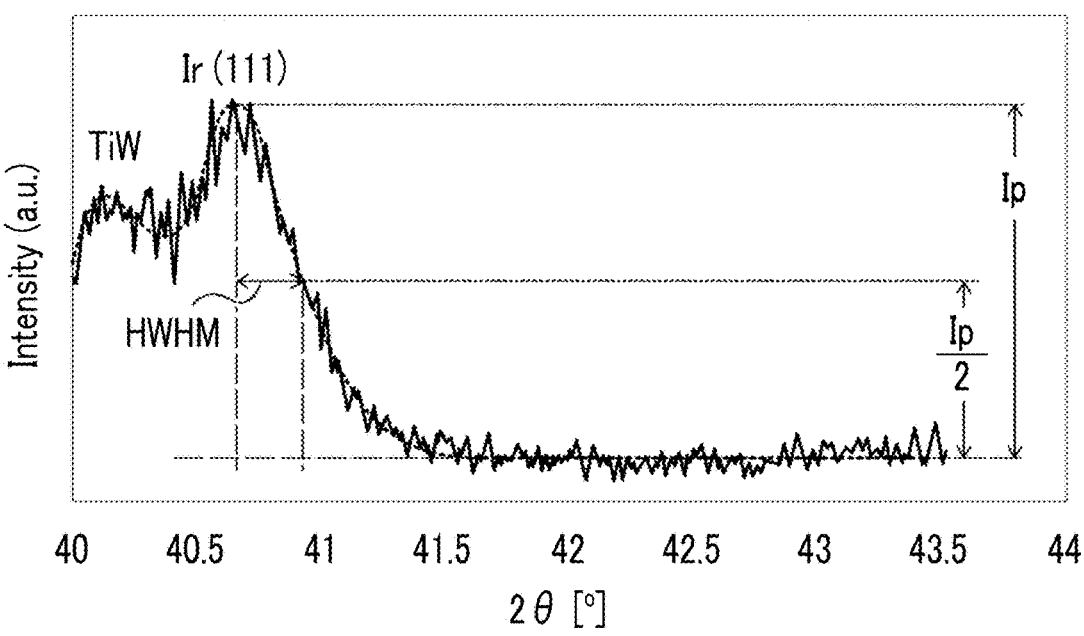
FIG. 7 is a graph showing an Ir (111) peak in an XRD chart from Example 1.

Regarding each of Examples and Comparative Examples, the half width at half maximum of the Ir (111) peak was determined by the XRD analysis using RINT-ULTIMA III manufactured by Rigaku Corporation. From the XRD chart obtained from each example, the half width at half maximum of the Ir (111) peak was determined. The Ir (111) peak is generated in the vicinity of 40.7°. FIG. 7 is a graph in which the vicinity of the Ir (111) peak of the XRD chart of Example 1 is enlarged. The Ir (111) peak is generated in the vicinity of $2\theta$=40.7°. In Example 1 shown in FIG. 7, the peak of the TiW layer, which is the first layer of the lower electrode layer, is partially overlapped with the Ir (111) peak. Fitting was carried out on such peaks using a double Gaussian function. In the fitting curve of the Ir (111) peak, the half width at half maximum (HWHM) was determined as a width between a $2\theta$ value at which the maximum value Ip of the Ir (111) peak is shown and a $2\theta$ value at which an intensity of ½ of the maximum value Ip is shown. The results are shown in Table 1.

Inclination of Ir (111) Plane of Lower Electrode Layer from Substrate Surface

Figure 8:
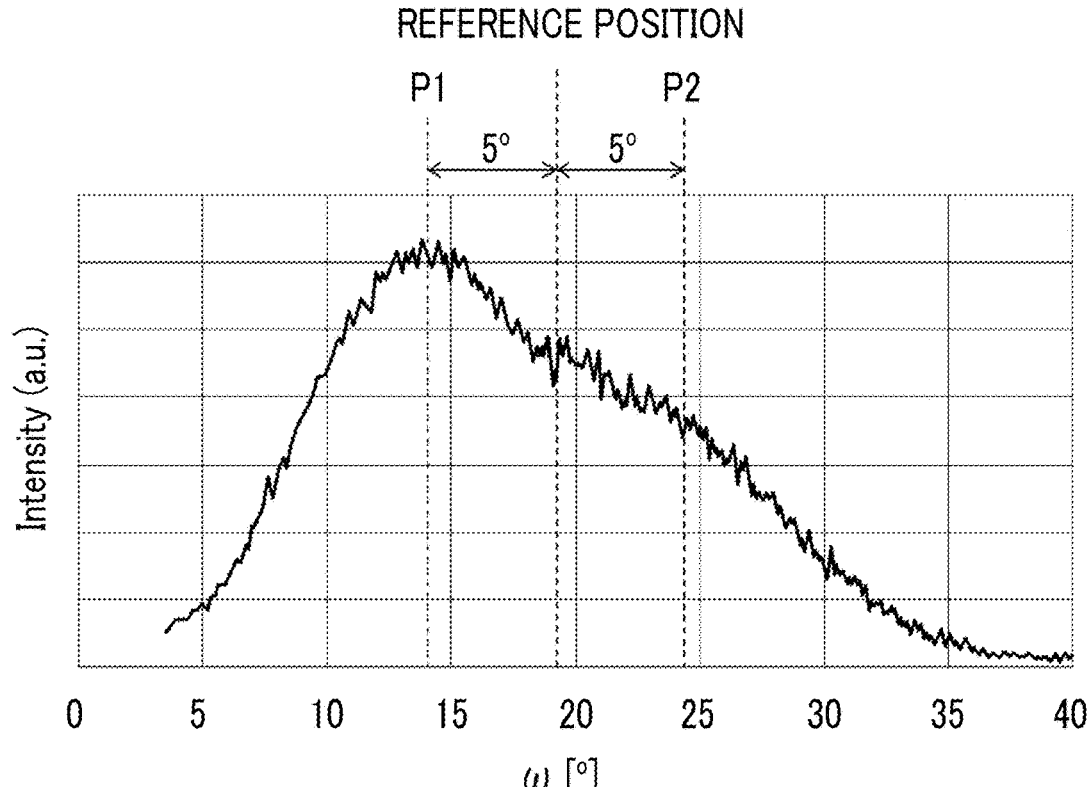
FIG. 8 is a graph showing a locking curve of the Ir (111) peak for Example 1.

Regarding Examples and Comparative Examples, the crystallinity of the first layer was evaluated by XRD using RINT ULTIMA III manufactured by Rigaku Corporation. Specifically, the inclination of the peak of the Ir (111) plane was determined, by the locking curve measurement, from the deviation of the position of the peak of the Ir (111) plane from that of the Ir peak in a case where the (111) plane was not inclined. FIG. 8 is the locking curve measurement data of Example 1. The reference position shown in the figure is a position of a peak of the (111) plane, where the peak appears in a case where the (111) plane is parallel to the surface of the substrate. The example shown in FIG. 8 has a first peak P1 and a second peak P2, and the split width therebetween is 10°. The center of the split width between the first peak P1 and the second peak P2 is the reference position, and in this example, it is meant that the (111) plane of the first layer is inclined by 5° with respect to a state the perovskite phase, and thus it is possible to specify the region of the pyrochlore phase and calculate the thickness thereof. It is noted that it was observed that columnar crystal bodies of the perovskite-type oxide were formed in the portion of the piezoelectric film other than the pyrochlore phase. The thickness of the pyrochlore phase was calculated as an average thickness since the pyrochlore phase was not uniformly formed on the surface of the lower electrode layer. It is noted that even in the case of the pyrochlore phase that is hardly confirmed on the XRD chart, the pyrochlore phase 16 is partially present as illustrated in the schematic view illustrated in FIG. 4, and this can be confirmed in the TEM image.

Specifically, the contrast adjustment function of the image processing software is used to binarize the original image at a predetermined threshold value, and the edge extraction function of the image processing software is used to extract the pyrochlore phase. In this case, the threshold value is such that noise is removed as much as possible and only those that can be clearly distinguished from the pyrochlore phase are extracted. In a case where the outline of the pyrochlore-type oxide layer is unclear in the binarized image, the outline is empirically drawn while looking at the binarized image, and the inside thereof is filled. The area of the extracted pyrochlore phase is calculated from the number of pixels obtained from the image processing software and divided by the visual field width of the TEM image to obtain the average layer thickness. As the image processing software, Photoshop (registered trade name) was used here. Table 1 shows the thickness of the pyrochlore phase obtained as described above.

TABLE 1

| | Lower electrode layer | | | | | | | | | |
|---|---|---|---|---|---|---|---|---|---|---|
| | First intimate attachment layer Material/thickness [nm] | First layer Material/thickness [nm] | Second intimate attachment layer Material/thickness [nm] | Second layer Material/thickness [nm] | Half width at half maximum of Ir (111) peak [°] | Inclination α of Ir (111) plane [°] | Resistivity [Ω/sq] | Thickness of pyrochlore phase [nm] | Piezoelectric constant [pm/V] | Reliability test [hr] |
| Comparative Example 1 | TiW/20 | Ir/150 | — | — | 0.25 | 0 | 0.8 | 50 | 200 | 250 |
| Comparative Example 2 | TiW/20 | Ir/50 | — | — | 0.38 | 5 | 4.1 | 20 | 180 | 700 |
| Comparative Example 3 | TiW/20 | Au/100 | TiW/20 | Ir/50 | 0.36 | 5 | 0.2 | 20 | 210 | 150 |
| Comparative Example 4 | TiW/20 | Ir/100 | TiW/20 | Ir/50 | 0.35 | 5 | 0.8 | 20 | 220 | 500 |
| Example 1 | TiW/20 | W/100 | TiW/20 | Ir/50 | 0.35 | 5 | 0.8 | 20 | 220 | 1000 |
| Example 2 | TiW/20 | Mo/100 | TiW/20 | Ir/50 | 0.35 | 5 | 0.8 | 20 | 220 | 800 |
| Example 3 | TiW/20 | Nb/100 | TiW/20 | Ir/50 | 0.35 | 5 | 0.9 | 20 | 210 | 800 |
| Example 4 | TiW/20 | Ta/100 | TiW/20 | Ir/50 | 0.35 | 5 | 0.9 | 20 | 210 | 900 |
| Example 5 | TiW/20 | W/200 | TiW/20 | Ir/50 | 0.34 | 5 | 0.5 | 20 | 230 | 950 |
| Example 6 | TiW/20 | W/100 | TiW/20 | Ir/10 | 0.4 | 6 | 1 | 20 | 190 | 1000 |
| Example 7 | TiW/20 | W/100 | TiW/20 | Ir/20 | 0.39 | 6 | 0.9 | 15 | 200 | 1000 |
| Example 8 | TiW/20 | W/100 | TiW/20 | Ir/30 | 0.38 | 5 | 0.9 | 15 | 210 | 1100 |
| Example 9 | TiW/20 | W/100 | TiW/20 | Ir/40 | 0.37 | 5 | 0.8 | 15 | 220 | 1200 |
| Example 10 | TiW/20 | W/100 | TiW/20 | Ir/45 | 0.37 | 5 | 0.8 | 15 | 220 | 1100 |
| Example 11 | TiW/20 | W/100 | — | Ir/50 | 0.35 | 5 | 0.8 | 20 | 220 | 700 | where it is parallel to the substrate. The measured values for each example are shown in Table 1.

Evaluation of Pyrochlore Phase Thickness

Regarding Examples and Comparative Examples, transmission electron microscope (TEM) images were captured, and the thickness of the pyrochlore phase was determined from the TEM images. In the piezoelectric film, the contrast in the TEM image differs between the pyrochlore phase and As shown in Table 1, the following results were obtained that the piezoelectric constant is large and that the long-term reliability is high in a case where the first layer of the lower electrode layer contains one or more of W, Mo, Nb, and Ta, as a main component, the second layer contains Ir as a main component, and the thickness of the second layer is 50 nm or less, as in Examples 1 to 11. In Comparative Example 1 in which the lower electrode layer did not have a layer containing one or more of W, Mo, Nb, and Ta, as a main component, and the thickness of the Ir layer was 150 nm, and in Comparative Examples 3 and 4 in which the first layers of the lower electrode layer were respectively Au and Ir, the long-term reliability was low. Further, even in a case where the Ir layer had a thickness of 50 nm, the piezoelectric constant was low and the resistivity was high in Comparative Example 2 in which the lower electrode layer did not have a layer containing one or more of W, Mo, Nb, and Ta, as a main component.

In addition, from the comparison of Examples 1 to 4, the following results were obtained that Example 1 in which the first layer is W, among W, Mo, Nb, and Ta, has the highest long-term reliability. Further, according to Example 1 and Examples 6 to 10, the following results were obtained that it is preferable that the piezoelectric constant is 200 pm/V or more, 1,000 hours or more in the long-term reliability test is achieved, and the thickness of the Ir layer, which is the second layer of the lower electrode layer, is 50 nm to 20 nm. Further, the following results were obtained that it is more preferable that the thickness of the Ir layer, which is the second layer of the lower electrode layer, is 45 nm to 30 nm since the piezoelectric constant is 210 pm/V or more and 1,100 hours or more in the long-term reliability test is achieved.

What is claimed is:

1. A piezoelectric laminate comprising, on a substrate in the following order:

a lower electrode layer; and a piezoelectric film containing a perovskite-type oxide, wherein the lower electrode layer includes a second layer arranged in a state of being in contact with the piezoelectric film and includes a first layer arranged on a side of the substrate than the second layer, the first layer contains one or more of W, Mo, Nb, and Ta, as a main component, and the second layer contains Ir as a main component, and a thickness of the second layer is 50 nm or less.

2. The piezoelectric laminate according to claim 1, wherein the thickness of the second layer is 45 nm or less.

3. The piezoelectric laminate according to claim 1, further comprising:

a first intimate attachment layer that improves adhesiveness between the substrate and the first layer, between the substrate and the first layer.

4. The piezoelectric laminate according to claim 3, wherein the first intimate attachment layer is a TiW layer.

5. The piezoelectric laminate according to claim 1, further comprising:

a second intimate attachment layer that improves adhesiveness between the first layer and the second layer, between the first layer and the second layer.

6. The piezoelectric laminate according to claim 5, wherein the second intimate attachment layer is a TiW layer.

7. The piezoelectric laminate according to claim 1, wherein the first layer is a W layer.

8. The piezoelectric laminate according to claim 1, wherein the perovskite-type oxide is a compound represented by General Formula (1), $$Pb\{(Zr_xTi_{1-x})_{1-y}B1_y\}O_3 \tag{1}$$

$0 < x < 1$, $0 < y < 0.4$, and

B1 is one or more elements selected from V, Nb, Ta, Sb, Mo, and W.

9. The piezoelectric laminate according to claim 1, wherein a half width at half maximum of an X-ray diffraction peak from a (111) plane of the Ir of the second layer is 0.3° or more.

10. The piezoelectric laminate according to claim 1, wherein the second layer is a uniaxial alignment film in which the Ir is aligned in a (111) plane, and the (111) plane has an inclination of 1° or more with respect to a thickness direction.

11. The piezoelectric laminate according to claim 1, wherein a pyrochlore phase is included at an interface between the lower electrode layer and the piezoelectric film, and a thickness of the pyrochlore phase is 20 nm or less.

12. A piezoelectric element comprising:

the piezoelectric laminate according to claim 1; and an upper electrode layer provided on the piezoelectric film of the piezoelectric laminate.

* * * * *